United States Patent
Wang (10) Patent No.: US 8,895,368 B2
(45) Date of Patent: Nov. 25, 2014

(54) METHOD FOR MANUFACTURING CHIP PACKAGE STRUCTURE

(71) Applicant: ChipMOS Technologies Inc., Hsinchu (TW)

(72) Inventor: Chien-Hao Wang, Hsinchu (TW)

(73) Assignee: ChipMOS Technologies Inc., Hsinchu (TW)

(*) Notice: Subject to any disclaimer, the term of this patent is extended or adjusted under 35 U.S.C. 154(b) by 0 days.

(21) Appl. No.: 14/133,593

(22) Filed: Dec. 18, 2013

(65) Prior Publication Data

US 2014/0322869 A1 Oct. 30, 2014

(30) Foreign Application Priority Data

Apr. 25, 2013 (TW) .............................. 102114827 A (51) Int. Cl.
*H01L 21/44* (2006.01)
*H01L 21/56* (2006.01)
*H01L 23/00* (2006.01)

(52) U.S. Cl.
CPC .............. *H01L 21/561* (2013.01); *H01L 24/81* (2013.01); *H01L 24/83* (2013.01)
USPC ........................... 438/126; 438/109; 438/127

(58) Field of Classification Search
USPC .......... 438/108, 112, 118, 124, 126, 127, 109
See application file for complete search history.

(56) References Cited

U.S. PATENT DOCUMENTS

| 7,273,768 | B2 * | 9/2007 | Hwan ........................... 438/113 |
| 7,662,667 | B2 * | 2/2010 | Shen ............................. 438/112 |
| 7,927,922 | B2 * | 4/2011 | Shen et al. ..................... 438/114 |
| 8,035,213 | B2 * | 10/2011 | Lee et al. ....................... 257/692 |
| 8,058,100 | B2 | 11/2011 | Pu et al. |
| 8,487,194 | B2 * | 7/2013 | Tuominen et al. ............ 174/260 |

FOREIGN PATENT DOCUMENTS

| TW | 543125 | 7/2003 |
| TW | I352410 | 11/2011 |

* cited by examiner

*Primary Examiner* — Kevin M Picardat
(74) *Attorney, Agent, or Firm* — Jianq Chyun IP Office (57) ABSTRACT

A method for manufacturing a chip package structure includes following steps. A carrier having a metal layer is provided. A patterned photoresist layer is formed on the metal layer. The patterned photoresist layer has a plurality of first openings exposing a portion of the metal layer. Connection terminals are formed in the first openings, respectively, and the connection terminals are connected to the metal layer. A chip is placed on the carrier, and first pads of the chip are respectively connected to the connection terminals through a plurality of connection conductors. After the chip is placed on the carrier, the patterned photoresist layer is removed. A encapsulant is formed on the carrier. The encapsulant encapsulates the chip, the connection conductors, and the metal layer. The carrier and the metal layer are removed to expose the connection terminals.

20 Claims, 14 Drawing Sheets

METHOD FOR MANUFACTURING CHIP PACKAGE STRUCTURE

CROSS-REFERENCE TO RELATED APPLICATION

This application claims the priority benefit of Taiwan application serial no. 102114827, filed on Apr. 25, 2013. The entirety of the above-mentioned patent application is hereby incorporated by reference herein and made a part of this specification.

BACKGROUND OF THE INVENTION

1. Field of the Invention

The invention relates to a method for manufacturing a package structure; more particularly, the invention relates to a method for manufacturing a chip package structure.

2. Description of Related Art

In recent years, with rapid progress of electronic technologies and advancement of high-tech electronic industry, human-oriented electronic products with superior performance have brought forth a new era and have been designed to cater to the trend of being light, thin, short, and small. Owing to said trend, circuit boards with fine pitch wires, compactness, and favorable performance have become one of the main media for holding a plurality of electronic devices (e.g., chips) and for electrically connecting the electronic devices to one another.

The flip-chip technology is a specific manner to package a chip over a circuit board. The circuit board has a plurality of pads thereon, and the circuit board can be electrically connected to the chip by means of a solder material on the pads through reflow. Recently, the number of signals transmitted among the electronic devices (e.g., chips) gradually increases, and therefore the number of pads required by the circuit board correspondingly increases. Due to the limited space in the circuit board, pitches among the pads are prone to become smaller and smaller.

A conventional chip package structure includes a chip, a substrate, a plurality of pads, a solder mask layer, and a plurality of solder bumps. The pads are located on a surface of a substrate. The solder mask layer covers the surface of the substrate and has a plurality of solder mask defined (SMD) openings respectively exposing the pads. The solder bumps respectively cover the pads and protrude from the openings. Through reflow, the substrate and the chip are electrically and structurally connected by means of the solder bumps located between the substrate and the chip.

To comply with the trend of fine pitch among the pads, the dimension of the openings of the solder mask layer is reduced, thus leading to an increase in the aspect ratio of the openings. This is detrimental to the printing or placement of large solder bumps; what is more, alignment between the solder bumps and the pads becomes more difficult. In addition, when the large solder bumps are placed on the pads and connected to the chip through reflow, the solder bumps subject to the heat generated through reflow are in a melted state. Since the pads are arranged on the surface of the substrate in a fine-pitch manner, bridge effects and short-circuit conditions may occur when the solder bumps are in the melted state during the reflow process; thereby, the requirement of fine-pitch cannot be satisfied.

SUMMARY OF THE INVENTION

The invention is directed to a method for manufacturing a chip package structure. The method not only achieves precise alignment between solder materials and pads but also prevents bridge effects and short-circuit conditions from occurring when the solder materials undergo a reflow process.

The invention is further directed to a method for manufacturing a chip package structure. The method allows a redistribution layer to be formed when pads are formed, so as to simplify the entire manufacturing process and improve production efficiency.

In an embodiment of the invention, a method for manufacturing a chip package structure includes following steps. A carrier having a metal layer is provided. A patterned photoresist layer is formed on the metal layer. The patterned photoresist layer has a plurality of first openings exposing a portion of the metal layer. Connection terminals are formed in the first openings, respectively, and the connection terminals are connected to the metal layer. A chip is placed on the carrier, and first pads of the chip are respectively connected to the connection terminals through a plurality of connection conductors. After the chip is placed on the carrier, the patterned photoresist layer is removed. A encapsulant is formed on the carrier. The encapsulant encapsulates the chip, the connection conductors, and the metal layer. The carrier and the metal layer are removed to expose the connection terminals.

In an embodiment of the invention, a method for manufacturing a chip package structure includes following steps. A carrier having a metal layer is provided. A patterned photoresist layer is formed on the metal layer. The patterned photoresist layer exposes a portion of the metal layer. A first redistribution layer is formed on the portion of the metal layer exposed by the patterned photoresist layer. The first redistribution layer includes a plurality of connection terminals and at least one wiring pattern. The wiring pattern is connected to at least one corresponding connection terminal. The patterned photoresist layer is then removed. A chip is placed on the carrier, and first pads of the chip are respectively connected to the connection terminals through a plurality of connection conductors. A encapsulant is formed on the carrier. The encapsulant encapsulates the chip, the connection conductors, the first redistribution layer, and the metal layer. The carrier and the metal layer are removed to expose the first redistribution layer.

According to the method for manufacturing the chip package structure described above, the patterned photoresist layer is removed after the chip is connected to the connection terminals of the carrier through the connection conductors. Thereby, precise alignment between the connection conductors and the connection terminals can be achieved, and the bridge of solder materials and the resultant short-circuit defect may be better prevented when the connection conductors and the connection terminals are connected. Additionally, in the method for manufacturing the chip package structure, the connection terminals may be formed together with the wiring pattern that is connected to the connection terminals, so as to rearrange the electrical contact points of the connection terminals. Thereby, the number of times of forming the redistribution layer subsequently may be reduced. As a result, the manufacturing costs may be lowered down, and the yield and the efficiency of the manufacturing process can be ameliorated.

In order to make the aforementioned and other features and advantages of the invention more comprehensible, embodiments accompanying figures are described in detail below.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the invention.

DETAILED DESCRIPTION OF DISCLOSED EMBODIMENTS

Figure 1A:
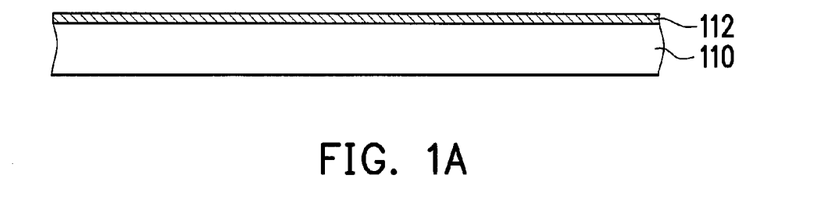
FIG. 1A to FIG. 1J are schematic cross-sectional flowcharts illustrating a method for manufacturing a chip package structure according to an embodiment of the invention.
Figure 1B:
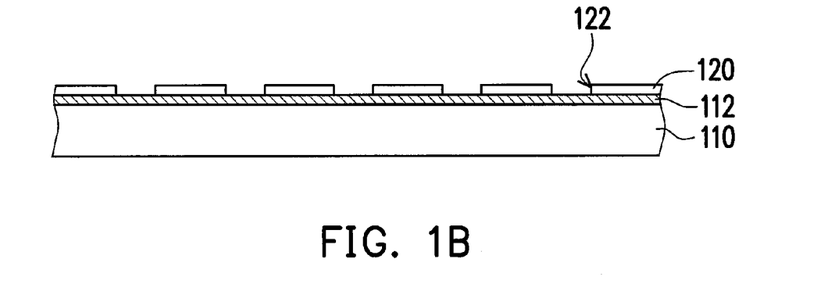
Figure 1C:
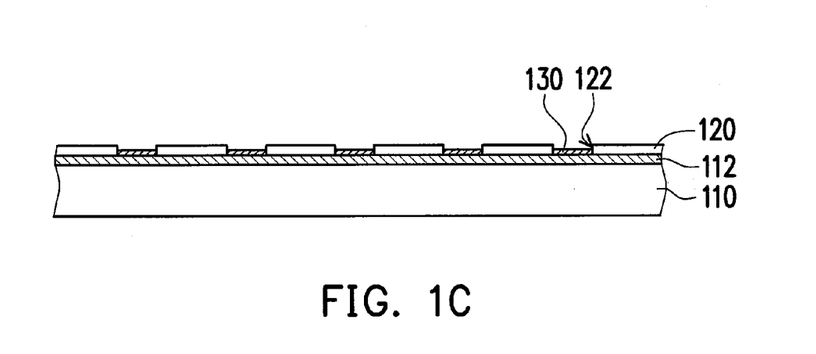
Figure 1D:
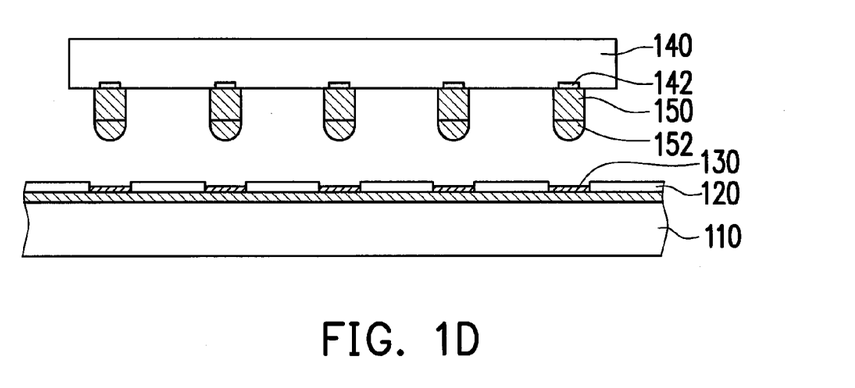
Figure 1E:
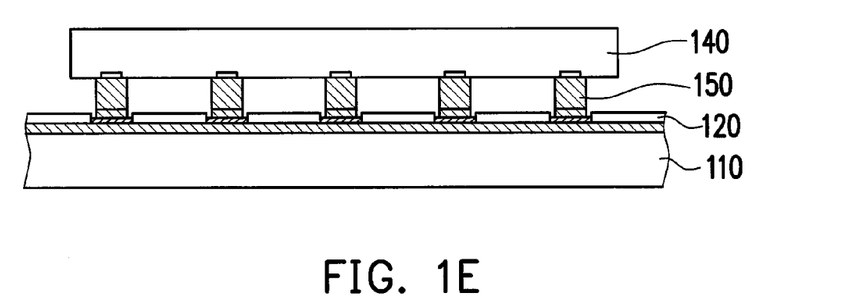

FIG. 1A to FIG. 1J are schematic cross-sectional flowcharts illustrating a method for manufacturing a chip package structure according to an embodiment of the invention. With reference to FIG. 1A and FIG. 1B, in the present embodiment, the method for manufacturing a chip package structure includes following steps. A carrier 110 is provided, and the carrier 110 has a metal layer 112. A patterned photoresist layer 120 is formed on the metal layer 112. As shown in FIG. 1B, the patterned photoresist layer 120 has a plurality of first openings 122 exposing a portion of the metal layer 112. With reference to FIG. 1C, connection terminals 130 are formed in the first openings 122, respectively, and the connection terminals 130 are connected to the metal layer 112. With reference to FIG. 1D and FIG. 1E, a chip 140 is placed on the carrier 110, and first pads 142 of the chip 140 are respectively connected to the connection terminals 130 through a plurality of connection conductors 150. In the present embodiment, the connection conductors 150 are formed on the first pads 142 of the chip 140 in advance, and the connection conductors 150 are formed through plating or sputtering, for instance. The connection terminals 130 are then electrically connected to the connection conductors 150, the connection conductors 150 and the connection terminals 130 are electrically connected through reflow, thermal compression, or ultrasonic welding, for instance. According to the present embedment, the connection terminals 130 are second pads arranged on the carrier 110, and the connection conductors 150 are conductive posts which may be made of gold, silver, copper, or any other similar conductive material. In another embodiment of the invention, a solder cap 152 may be formed on the top of the conductive posts in advance, or a solder cap (not shown) may be formed on the connection terminals 130 in advance for welding and bonding. Certainly, the present embodiment merely serves as an example, and the type of the connection conductor and the type of the connection terminals are not limited in the invention.

In addition, the step of forming the chip 140 on the carrier 110 may include a step of providing a wafer (not shown), and the wafer includes a plurality of chips connected to one another and arranged in arrays. After that, the wafer is cut, such that the chips are separated from one another. One of the separated chips (i.e., the chips 140) is placed on the carrier 110. Before the wafer is cut, the connection conductors 150 may be formed on the first pads of the chips which are connected to one another and arranged in arrays.

Figure 1F:
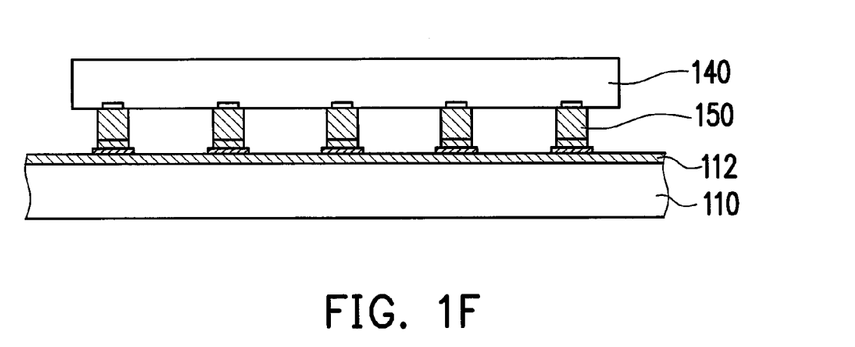
Figure 1G:
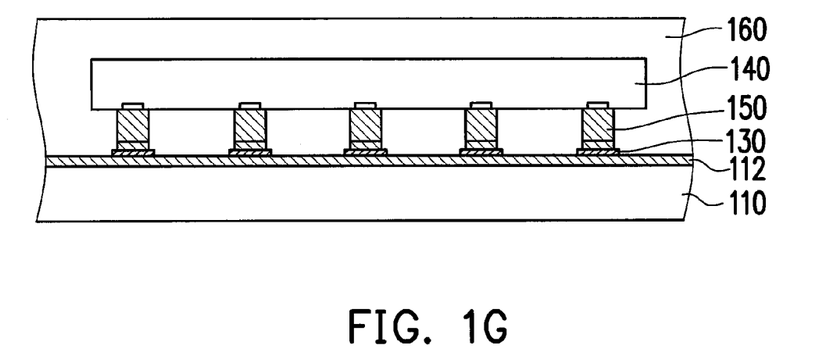
Figure 1H:
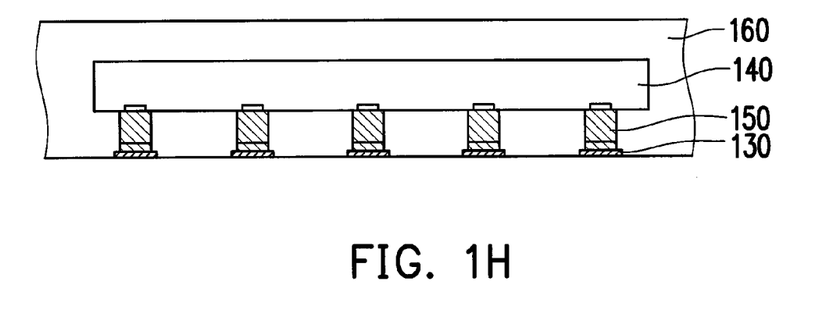

With reference to FIG. 1F, after the chip 140 is placed on the carrier 110, the patterned photoresist layer 120 shown in FIG. 1E is removed. With reference to FIG. 1G, a encapsulant 160 is formed on the carrier 110. The encapsulant 160 encapsulates the chip 140, the connection conductors 150, the connection terminals 130, and the metal layer 112. The carrier 110 and the metal layer 112 shown in FIG. 1G are then removed, so as to expose the connection terminals 130 as shown in FIG. 1H.

Figure 1I:
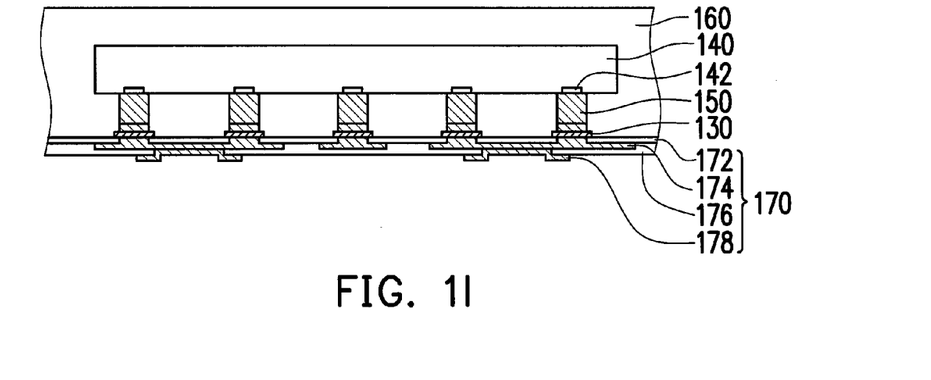

With reference to FIG. 1I, after the connection terminals 130 are exposed, a redistribution layer 170 is formed. The redistribution layer 170 covers a portion of the encapsulant 160 and is electrically connected to the exposed connection terminals 130, so as to rearrange the electrical contact points between the connection terminals 130 and external electronic devices. In the present embodiment, a process of forming the redistribution layer 170 may include following steps. A first protection layer 172 is formed, and the first protection layer 172 covers a portion of the encapsulant 160 and exposes the connection terminals 130. A patterned wiring layer 174 is formed on the first protection layer 172 and the connection terminals 130, and the patterned wiring layer 174 covers a portion of the first protection layer 172 and is connected to the connection terminals 130, as shown in FIG. 1I. A second protection layer 176 is formed on the first protection layer 172 and the patterned wiring layer 174, and the second protection layer 176 exposes a portion of the patterned wiring layer 174. Solder pads 178 are formed on the patterned wiring layer 174 and respectively connected to the portion of the patterned wiring layer 174 exposed by the second protection layer 176. Through the redistribution layer 170, the contact points of the chip 140 may be relocated from where the connection terminals 130 are located to where the solder pads 178 are located, so as to electrically connect the external electronic devices. The patterned wiring layer 174 and the solder pads 178 are formed by plating or sputtering, for instance.

Figure 1J:
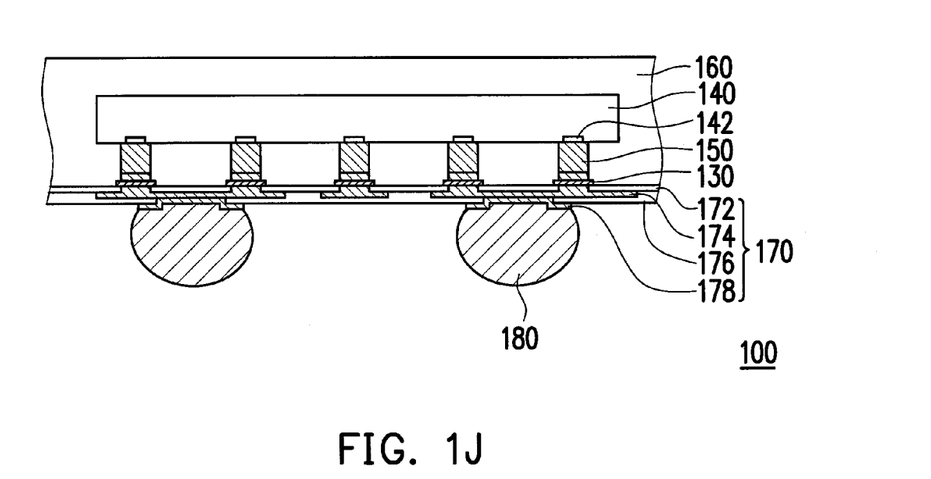

As shown in FIG. 1J, second solder balls 180 are formed on the solder pads 178. So far, the chip package structure 100 is completely formed. According to present embodiment, in the method for manufacturing the chip package structure, the patterned photoresist layer 120 is removed after the chip 140 is placed on the carrier 110. Thereby, precise alignment between the connection conductors 150 and the connection terminals 130 can be achieved, and the bridge of solder materials and the resultant short-circuit defect may be better prevented when the connection conductors 150 and the connection terminals 130 are connected.

FIG. 2A to FIG. 2G are schematic cross-sectional flowcharts illustrating some steps in a method for manufacturing a chip package structure according to another embodiment of the invention. It should be mentioned that reference numbers and some descriptions provided in the previous exemplary embodiment are also applied in the following exemplary embodiment. The same reference numbers represent the same or similar components in these exemplary embodiments, and repetitive descriptions are omitted. The omitted descriptions may be referred to as those described in the previous embodiment.

Figure 2A:
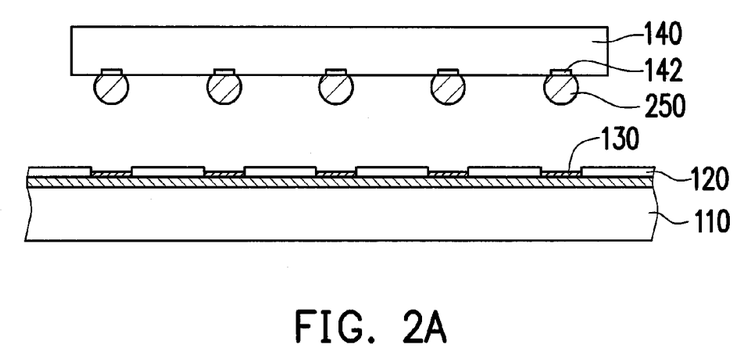
FIG. 2A to FIG. 2G are schematic cross-sectional flowcharts illustrating some steps in a method for manufacturing a chip package structure according to another embodiment of the invention.
Figure 2B:
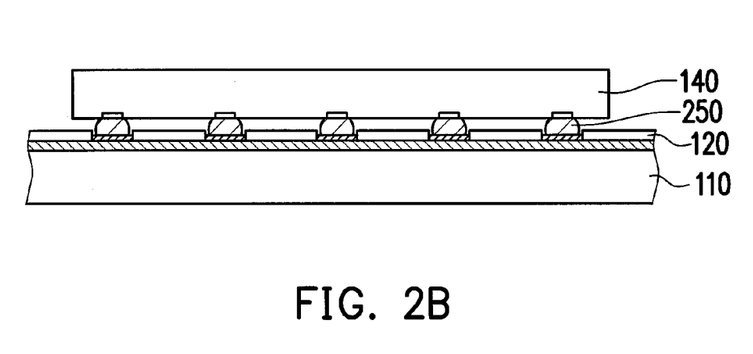

In the method for manufacturing the chip package structure described herein, the steps shown in FIG. 1A to FIG. 1C and described in the previous embodiment are also applicable here. That is, the method for manufacturing the chip package structure described herein includes the steps shown in FIG. 1A to FIG. 1C, and after the connection terminals 130 shown in FIG. 1C are formed in the first openings 122 of the patterned photoresist layer 120, the chip 140 is placed on the carrier 110, and the first pads 142 of the chip 140 are connected to the connection terminals 130 through a plurality of connection conductors 250, as shown in FIG. 2A and FIG. 2B. According to the present embodiment, the connection terminals 130 are second pads, as described in the previous embodiment, and the connection conductors 250 are first solder balls. The connection conductors 250 are formed on the first pads 142 of the chip 140 in advance and then electrically connected to the connection terminals 130, and the connection conductors 150 are connected to the connection terminals 130 and the first pads 142 through reflow, thermal compression, or ultrasonic welding, for instance. In another embodiment of the invention, the connection conductors 250 are formed on the first pads 142 through plating, sputtering, printing, or ball placement. Since the patterned photoresist layer 120 has not yet been removed at this time, and the thickness of the connection terminals 130 may be smaller than the thickness of the patterned photoresist layer 120, the patterned photoresist layer 120 is conducive to the alignment between the connection conductors 250 of the chip 140 and the connection terminals 130.

Figure 2C:
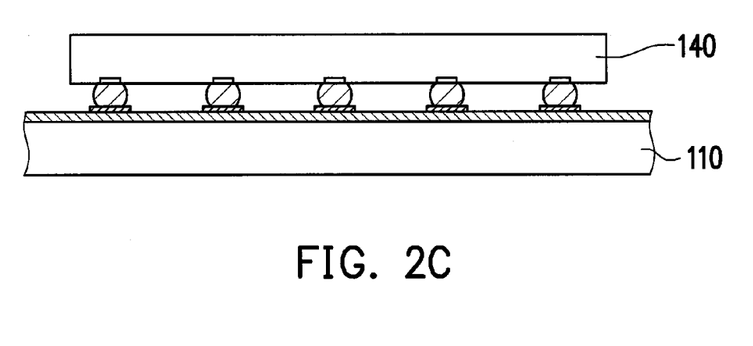
Figure 2D:
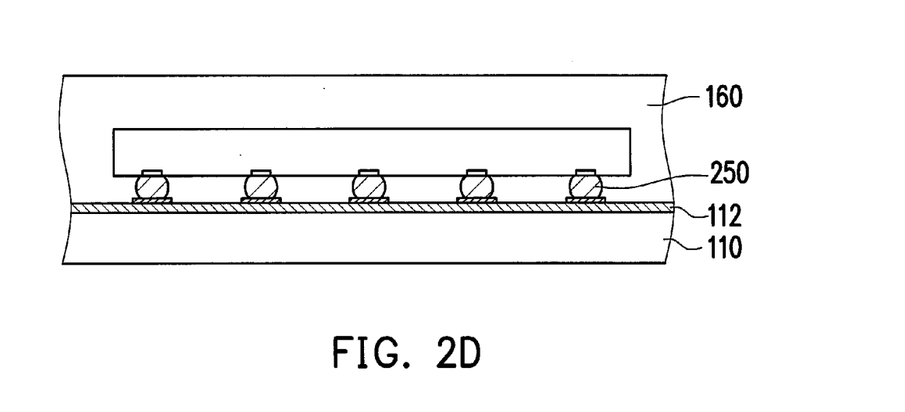
Figure 2E:
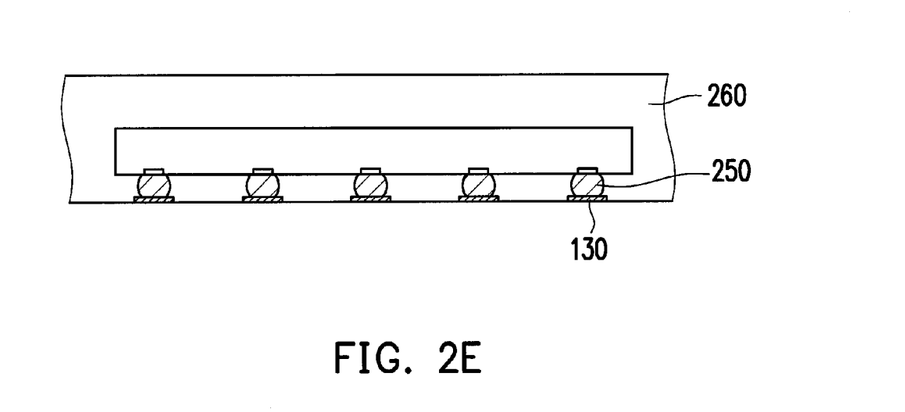

With reference to FIG. 2C, after the chip 140 is formed and placed on the carrier 110, the patterned photoresist layer 120 shown in FIG. 2B is removed. With reference to FIG. 2D, a encapsulant 160 is formed on the carrier 110. As described in the previous embodiment, the encapsulant 160 encapsulates the chip 140, the connection conductors 250, the connection terminals 130, and the metal layer 112. The carrier 110 and the metal layer 112 shown in FIG. 2D are then removed, so as to expose the connection terminals 130 as shown in FIG. 2E.

Figure 2F:
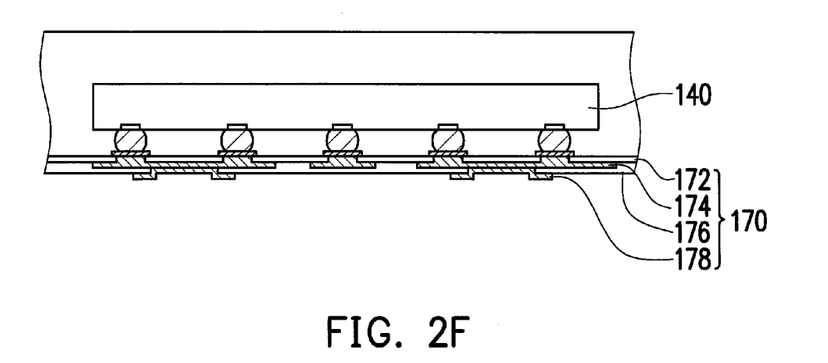
Figure 2G:
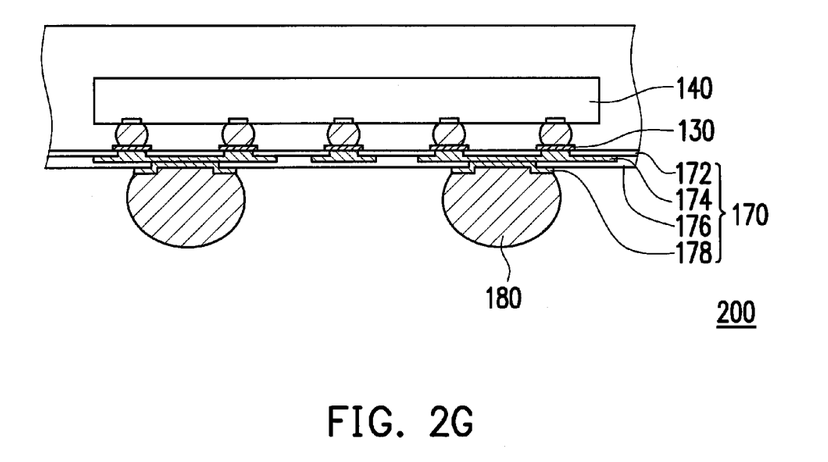

With reference to FIG. 2F, after the connection terminals 130 are exposed, a redistribution layer 170 is formed, and the redistribution layer 170 includes the first protection layer 172, the patterned wiring layer 174, the second protection layer 176, and the solder pads 178, as provided in the previous embodiment. The detailed arrangement and the manufacturing process of the redistribution layer 170 may be referred to as those described in the previous embodiment and thus will not be explained hereinafter. With reference to FIG. 2G second solder balls 180 are formed on the solder pads 178, such that the contact points of the chip 140 may be relocated from where the connection terminals 130 are located to where the solder pads 178 are located and may be electrically connected to the external electronic devices through the second solder balls 180. So far, the chip package structure 200 is completely formed.

FIG. 3A to FIG. 3I are schematic cross-sectional flowcharts illustrating some steps in a method for manufacturing a chip package structure according to another embodiment of the invention. It should be mentioned that reference numbers and some descriptions provided in the previous exemplary embodiment are also applied in the following exemplary embodiment. The same reference numbers represent the same or similar components in these exemplary embodiments, and repetitive descriptions are omitted. The omitted descriptions may be referred to as those described in the previous embodiments.

Figure 3A:
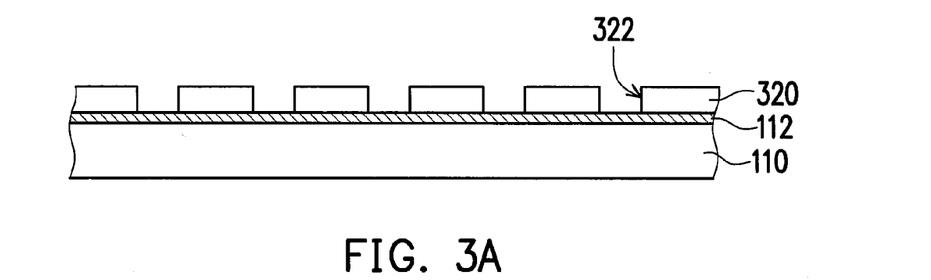
FIG. 3A to FIG. 3I are schematic cross-sectional flowcharts illustrating some steps in a method for manufacturing a chip package structure according to another embodiment of the invention.
Figure 3B:
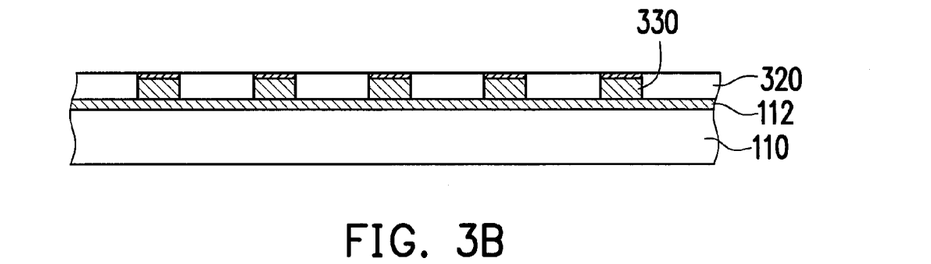
Figure 3C:
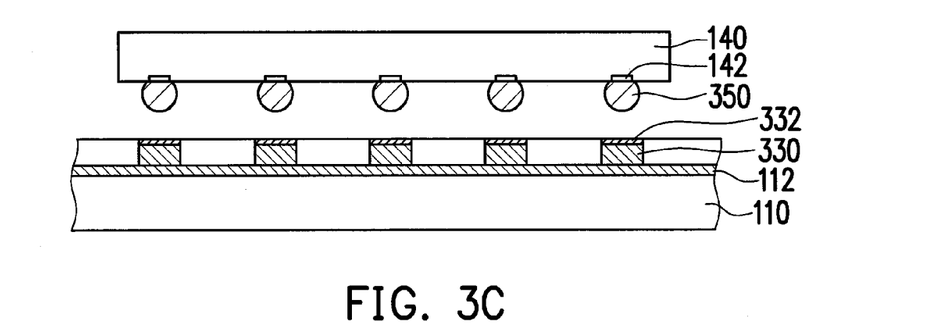
Figure 3D:
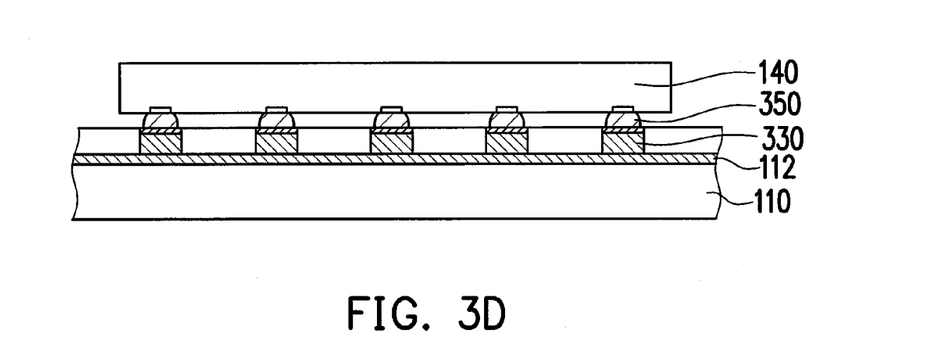

In the method for manufacturing the chip package structure described herein, the step shown in FIG. 1A and described in the previous embodiment are also applicable here. That is, the method for manufacturing the chip package structure described herein includes the step shown in FIG. 1A, and after the carrier 110 having the metal layer 112 is provided, a patterned photoresist layer 320 is formed on the metal layer 112, as shown in FIG. 3A. The patterned photoresist layer 320 in FIG. 3A has a plurality of first openings 322 exposing a portion of the metal layer 112. With reference to FIG. 3B, connection terminals 330 are formed in the first openings 322, respectively, and the connection terminals 330 are connected to the metal layer 112. In the present embodiments, the connection terminals 330 are conductive bumps, and thus the thickness of the patterned photoresist layer 320 for forming the connection terminals 330 may be substantially greater than the thickness of the patterned photoresist layer 120. The connection terminals 330 may be formed by plating, sputtering, screen printing, or the like. With reference to FIG. 3C and FIG. 3D, the chip 140 is placed on the carrier 110, and first pads 142 of the chip 140 are respectively connected to the connection terminals 330 through a plurality of connection conductors 350. In the present embodiment, the connection conductors 350 are first solder balls. The connection conductors 350 may be formed on the first pads 142 of the chip 140, and then the connection conductors 350 are electrically connected to the connection terminals 330 in a flip-chip manner. In an embodiment of the invention, a wettable layer 332 which is conducive to the connection between the connection conductors 350 and the connection terminals 330 are connected is formed on a connection surface where the connection conductors 350 and the connection terminals 330 are connected, and the wettable layer 332 is made of nickel, gold, or an organic solderability preservative (OSP). Here, the connection between the connection conductors 350 and the connection terminals 330 and the connection between the connection conductors 350 and the first pads 142 are achieved by reflow, thermal compression, or ultrasonic welding. Since the patterned photoresist layer 320 has not yet been removed at this time, the patterned photoresist layer 320 is conducive to the alignment between the connection conductors 350 of the chip 140 and the connection terminals 330.

Figure 3E:
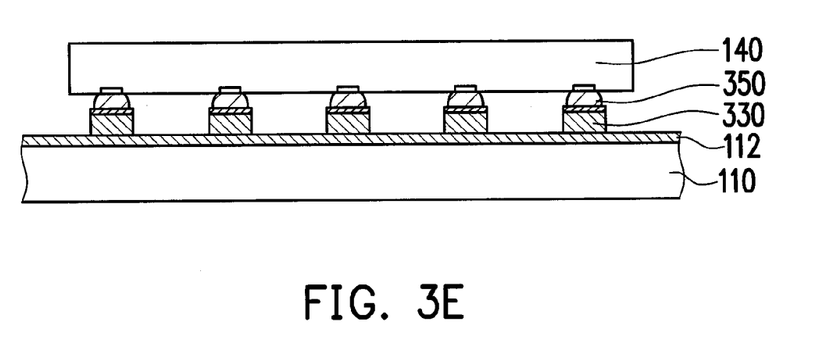
Figure 3F:
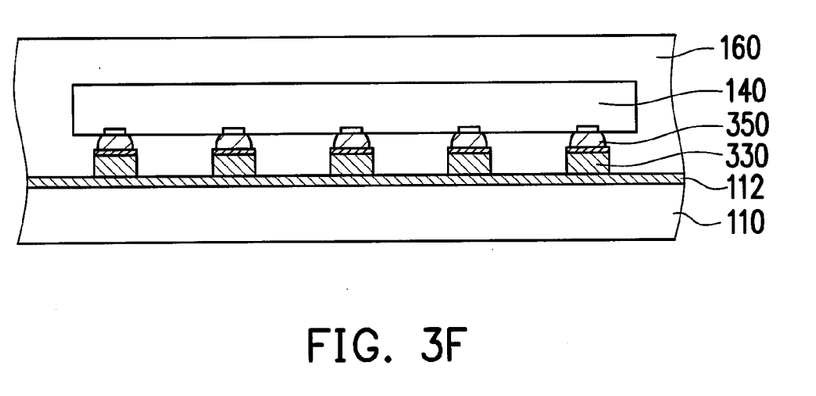
Figure 3G:
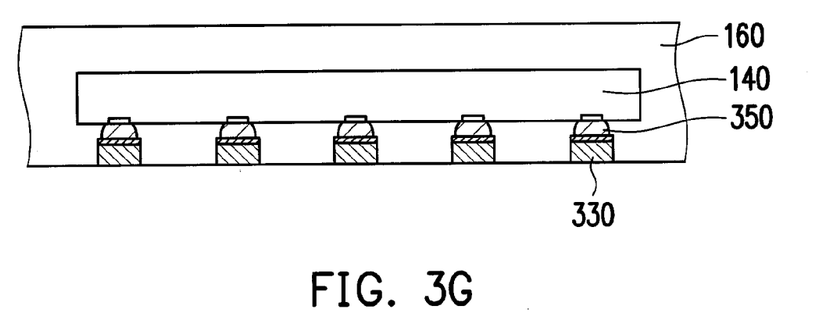

With reference to FIG. 3E, after the chip 140 is placed on the carrier 110, the patterned photoresist layer 320 shown in FIG. 3D is removed. With reference to FIG. 3F, the encapsulant 160 is formed on the carrier 110. As described in the previous embodiment, the encapsulant 160 encapsulates the chip 140, the connection conductors 350, the connection terminals 330, and the metal layer 112. The carrier 110 and the metal layer 112 shown in FIG. 3F are then removed, so as to expose the connection terminals 330 as shown in FIG. 3G.

Figure 3H:
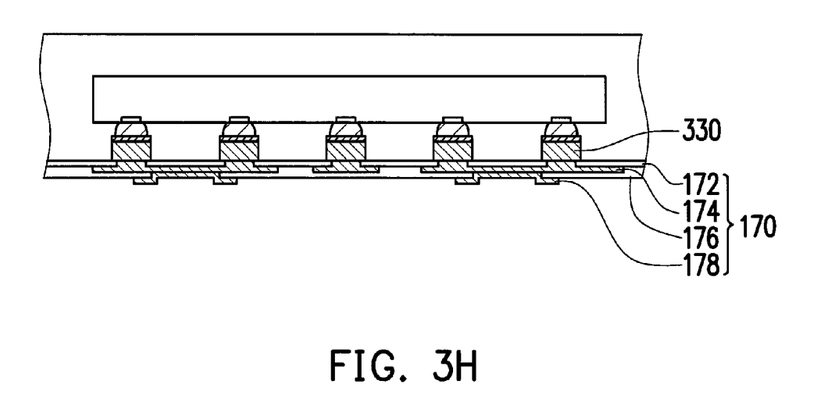
Figure 3I:
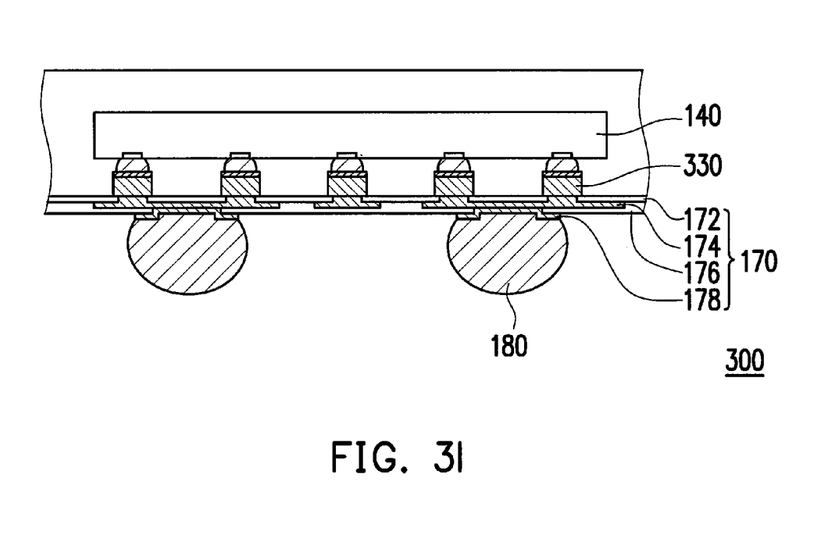

With reference to FIG. 3H, after the connection terminals 330 are exposed, the redistribution layer 170 is formed, and the redistribution layer 170 includes the first protection layer 172, the patterned wiring layer 174, the second protection layer 176, and the solder pads 178, as provided in the previous embodiment. The detailed arrangement and the manufacturing process of the redistribution layer 170 may be referred to as those described in the previous embodiment and thus will not be explained hereinafter. With reference to FIG. 3I, the second solder balls 180 are formed on the solder pads 178, such that the contact points of the chip 140 may be relocated from where the connection terminals 330 are located to where the solder pads 178 are located and may be electrically connected to the external electronic devices through the second solder balls 180. So far, the chip package structure 300 is completely formed.

FIG. 4A to FIG. 4I are schematic cross-sectional flowcharts illustrating some steps in a method for manufacturing a chip package structure according to another embodiment of the invention. It should be mentioned that reference numbers and some descriptions provided in the previous exemplary embodiments are also applied in the following exemplary embodiment. The same reference numbers represent the same or similar components in these exemplary embodiments, and repetitive descriptions are omitted. The omitted descriptions may be referred to as those described in the previous embodiments.

Figure 4A:
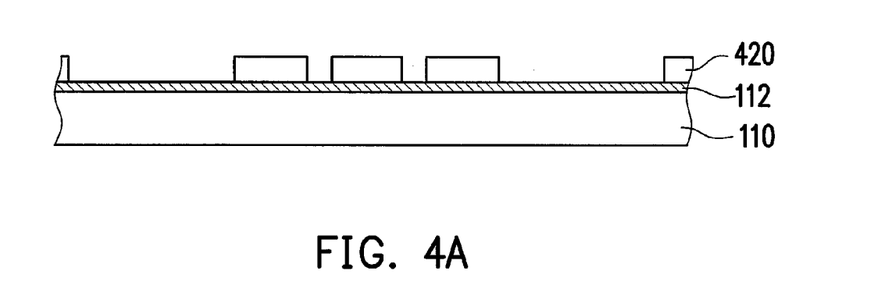
FIG. 4A to FIG. 4I are schematic cross-sectional flowcharts illustrating some steps in a method for manufacturing a chip package structure according to another embodiment of the invention.
Figure 4B:
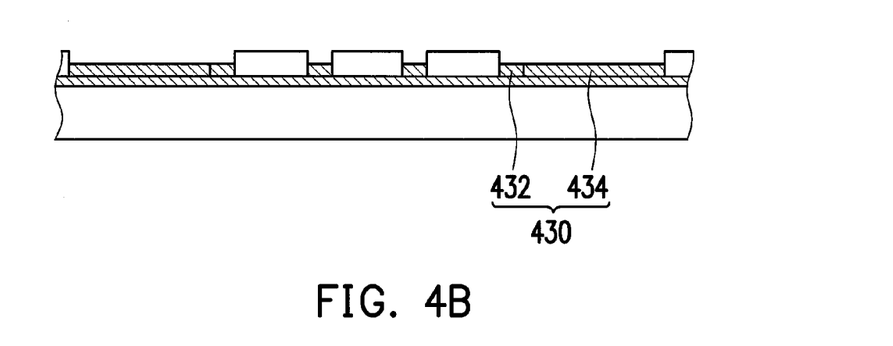
Figure 4C:
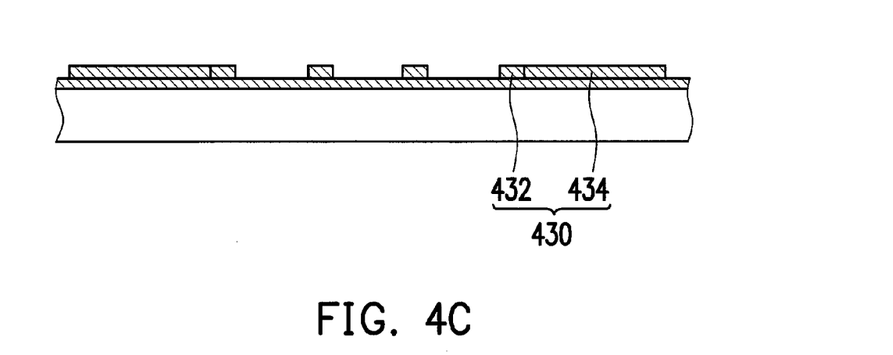

In the method for manufacturing the chip package structure described herein, the step shown in FIG. 1A and described in the previous embodiment are also applicable here. That is, the method for manufacturing the chip package structure described herein includes the step shown in FIG. 1A, and after the carrier 110 having the metal layer 112 is provided, a patterned photoresist layer 420 is formed on the metal layer 112, as shown in FIG. 4A. The patterned photoresist layer 420 exposes a portion of the metal layer 112. With reference to FIG. 4B, a first redistribution layer 430 is formed on the portion of the metal layer 112 exposed by the patterned photoresist layer 420. The first redistribution layer 430 includes a plurality of connection terminals 432 and at least one wiring pattern 434. As shown in FIG. 4B, the wiring pattern 434 is connected to the corresponding connection terminal 432. In the present embodiment, the connection terminals 432 are second pads. With reference to FIG. 4C, the patterned photoresist layer 420 shown in FIG. 4B is removed; with reference to FIG. 4D and FIG. 4E, the chip 140 is placed on the carrier 110, and the first pads 142 of the chip 140 are respectively connected to the connection terminals 432 through a plurality of connection conductors 450. In the present embodiment, the connection conductors 450 are first solder balls, while the invention is not limited thereto. In another embodiment of the invention, the connection conductors may also be conductive posts. The connection conductors 450 are formed on the first pads 142 of the chip 140 in advance and then electrically connected to the connection terminals 432, and the connection conductors 450 are connected to the connection terminals 432 and the first pads 142 through reflow, thermal compression, or ultrasonic welding, for instance.

Figure 4D:
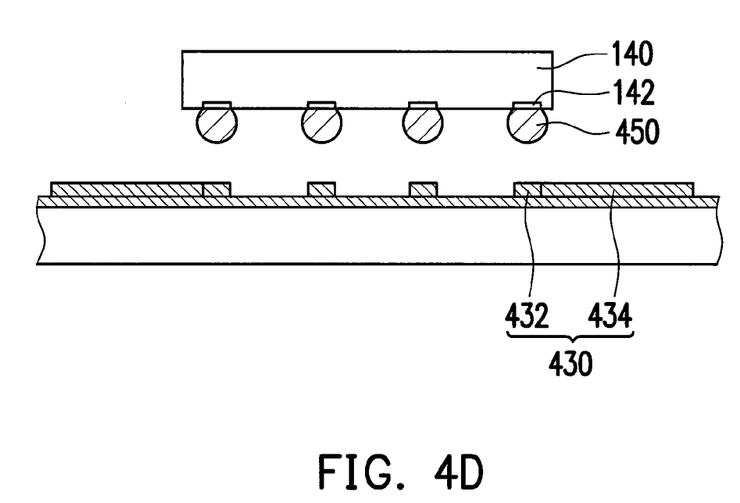
Figure 4E:
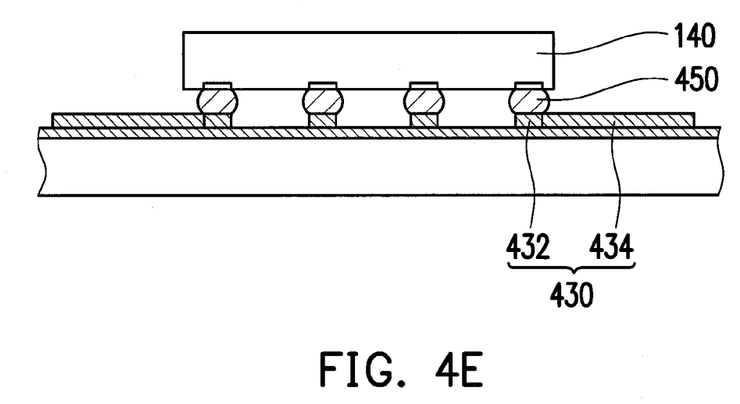

In addition, the step of placing the chip 140 on the carrier 110 may include a step of providing a wafer (not shown), as described above, and the wafer includes a plurality of chips connected to one another and arranged in arrays. After that, the wafer is cut, such that the chips 140 are separated from one another. One of the separated chips (e.g., the chips 140) is placed on the carrier 110. Before the wafer is cut, the connection conductors 450 may be formed on the first pads of the chips which are connected to one another and arranged in arrays.

Figure 4F:
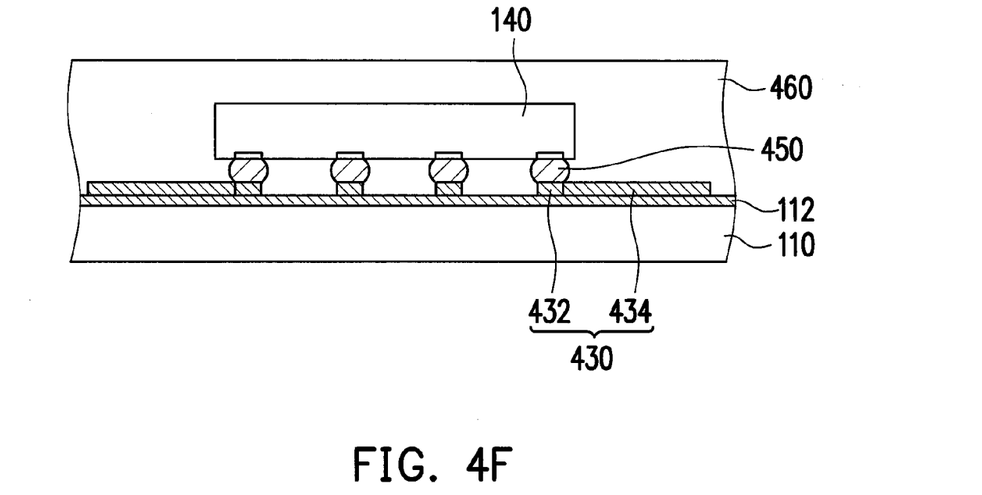
Figure 4G:
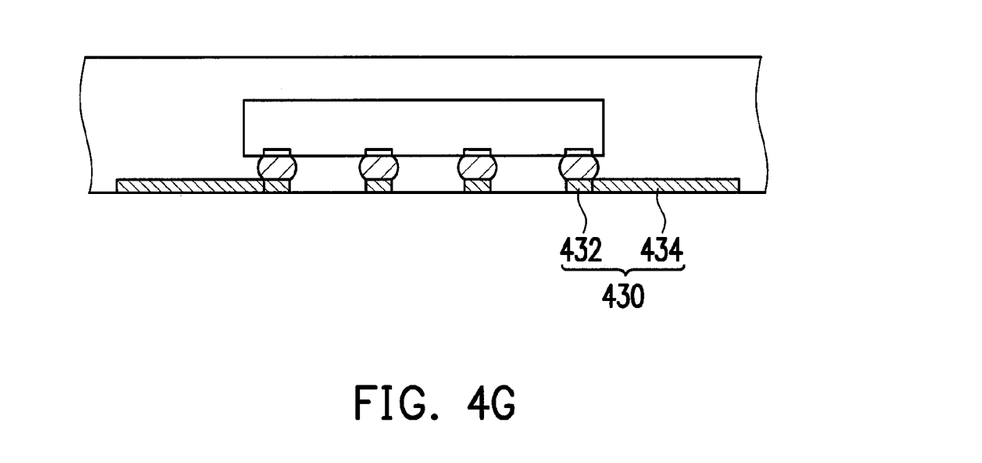

With reference to FIG. 4F, a encapsulant 460 is formed on the carrier 110. The encapsulant 460 encapsulates the chip 140, the connection conductors 450, the first redistribution layer 430, and the metal layer 112. The carrier 110 and the metal layer 112 shown in FIG. 4F are then removed, so as to expose the first redistribution layer 430 as shown in FIG. 4G.

Figure 4H:
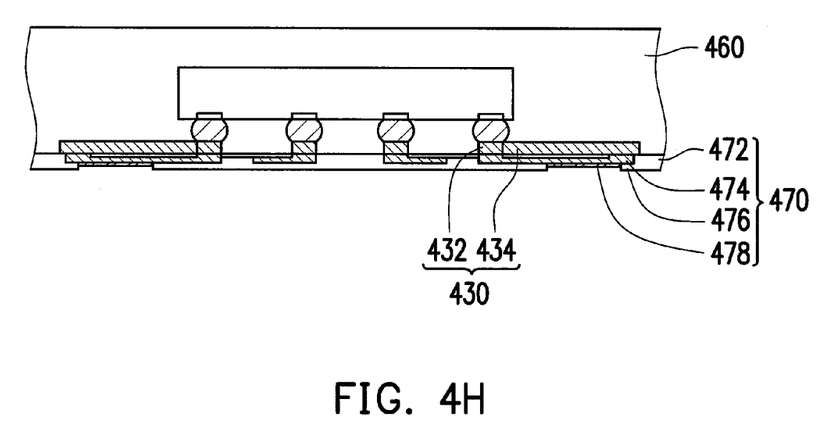

With reference to FIG. 4H, after the first redistribution layer 430 is exposed, a second redistribution layer 470 is formed, and the second redistribution layer 470 covers a portion of the encapsulant 460 and is electrically connected to the exposed first redistribution layer, so as to rearrange the electrical contact points between the connection terminals 432 and external electronic devices. In the present embodiment, a process of forming the first redistribution layer 470 may include following steps. A first protection layer 472 is formed, and the first protection layer 472 covers a portion of the encapsulant 460 and exposes the connection terminals 432 and a portion of the wiring pattern 434. A patterned wiring layer 474 is formed on the first protection layer 472 and the connection terminals 432, and the patterned wiring layer 474 covers a portion of the first protection layer 472 and is connected to the connection terminals 432 and the portion of the wiring pattern 434 exposed by the first protection layer 472. A second protection layer 476 is formed on the first protection layer 472 and the patterned wiring layer 474, and the second protection layer 476 exposes a portion of the patterned wiring layer 474. Solder pads 478 are then formed on the patterned wiring layer 474. The solder pads 478 are respectively connected to the portion of the patterned wiring layer 474 exposed by the second protection layer 476.

Figure 4I:
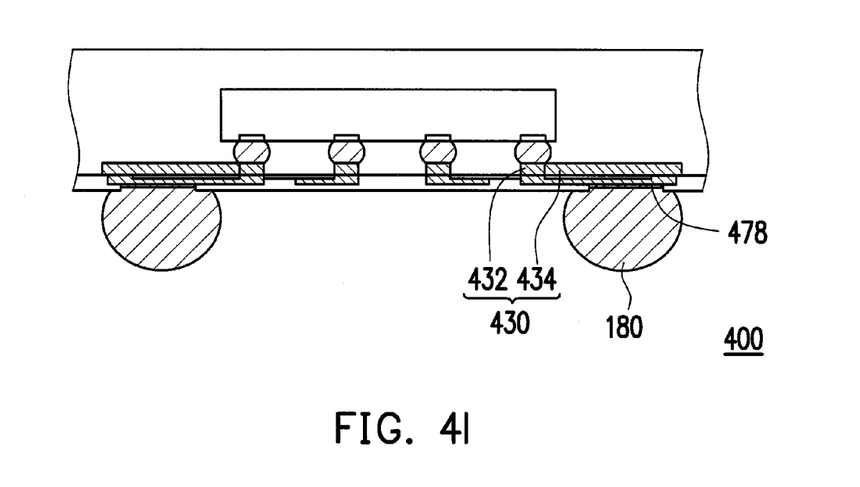

As shown in FIG. 4I, the second solder balls 180 are formed on the solder pads 478. So far, the chip package structure 400 is completely formed. In the method for manufacturing the chip package structure, the connection terminals 432 are formed together with the wiring pattern 434 that is connected to the connection terminals 432, so as to rearrange the electrical contact points of the connection terminals 432. Thereby, the number of times of forming the redistribution layer subsequently is reduced, the manufacturing costs are lowered down, and the manufacturing efficiency is improved.

To sum up, according to the method for manufacturing the chip package structure described above, the patterned photoresist layer is removed after the chip is connected to the connection terminals of the carrier through the connection conductors. Thereby, precise alignment between the connection conductors and the connection terminals can be achieved, and the bridge of solder materials and the resultant short-circuit defect may be better prevented when the connection conductors and the connection terminals are connected. Additionally, in the method for manufacturing the chip package structure, the connection terminals may be formed together with the wiring pattern that is connected to the connection terminals, so as to rearrange the electrical contact points of the connection terminals. Thereby, the number of times of forming the redistribution layer subsequently may be reduced. As a result, the manufacturing yield and the manufacturing efficiency of the manufacturing process can be ameliorated.

It will be apparent to those skilled in the art that various modifications and variations can be made to the structure of the disclosed embodiments without departing from the scope or spirit of the invention. In view of the foregoing, it is intended that the invention cover modifications and variations of this invention provided they fall within the scope of the following claims and their equivalents.

What is claimed is:

1. A method for manufacturing a chip package structure, the method comprising:
   providing a carrier, the carrier having a metal layer;
   forming a patterned photoresist layer on the metal layer, the patterned photoresist layer having a plurality of first openings exposing a portion of the metal layer;
   forming a plurality of connection terminals in the first openings, respectively, the connection terminals being connected to the metal layer;
   placing a chip on the carrier and connecting a plurality of first pads of the chip to the connection terminals through a plurality of connection conductors;
   removing the patterned photoresist layer after the chip is placed on the carrier;
   forming a encapsulant on the carrier, the encapsulant encapsulating the chip, the connection conductors, and the metal layer;
   removing the carrier and the metal layer to expose the connection terminals; and
   forming a redistribution layer after removing the metal layer, wherein the redistribution layer covers a portion of the encapsulant and is electrically connected to the connection terminals.

2. The method as recited in claim 1, wherein the connection conductors are formed on the first pads before the connection terminals and the first pads are connected through the connection conductors.

3. The method as recited in claim 1, wherein the connection conductors are conductive posts, and the connection terminals are second pads.

4. The method as recited in claim 1, wherein the connection conductors are first solder balls, and the connection terminals are second pads.

5. The method as recited in claim 2, wherein the connection conductors are first solder balls, and the connection terminals are conductive bumps.

6. The method as recited in claim 1, wherein the connection conductors are formed on the connection terminals before the connection terminals and the first pads are connected through the connection conductors.

7. The method as recited in claim 5, wherein the connection conductors are first solder balls, and the connection terminals are conductive bumps.

8. The method as recited in claim 1, wherein the connection conductors and the connection terminals are connected through reflow, thermal compression, or ultrasonic welding.

9. The method as recited in claim 1, wherein the connection conductors are formed on the first pads through plating, sputtering, printing, or ball placement.

10. The method as recited in claim 1, wherein the step of forming the redistribution layer comprises:
    forming a first protection layer, the first protection layer covering a portion of the encapsulant and exposing the connection terminals;
    forming a patterned wiring layer on the first protection layer and the connection terminals, the patterned wiring layer covering a portion of the first protection layer and being connected to the connection terminals; and
    forming a second protection layer on the first protection layer and the patterned wiring layer, the second protection layer exposing a portion of the patterned wiring layer; and
    forming a plurality of solder pads on the patterned wiring layer, the solder pads being respectively connected to the portion of the patterned wiring layer exposed by the second protection layer.

11. The method as recited in claim 10, further comprising:
    forming a plurality of second solder balls on the solder pads.

12. A method for manufacturing a chip package structure, the method comprising:
    providing a carrier, the carrier having a metal layer;
    forming a patterned photoresist layer on the metal layer, the patterned photoresist layer exposing a portion of the metal layer;
    forming a first redistribution layer on the portion of the metal layer exposed by the patterned photoresist layer, the first redistribution layer comprising a plurality of connection terminals and at least one wiring pattern, the at least one wiring pattern being connected to at least one corresponding connection terminal of the connection terminals;
    removing the patterned photoresist layer;
    placing a chip on the carrier and connecting a plurality of first pads of the chip to the connection terminals through a plurality of connection conductors;
    forming a encapsulant on the carrier, the encapsulant encapsulating the chip, the connection conductors, the first redistribution layer, and the metal layer; and
    removing the carrier and the metal layer to expose the first redistribution layer.

13. The method as recited in claim 12, wherein the connection conductors are formed on the first pads before the connection terminals and the first pads are connected through the connection conductors.

14. The method as recited in claim 12, wherein the connection conductors are conductive posts, and the connection terminals are second pads.

15. The method as recited in claim 12, wherein the connection conductors are first solder balls, and the connection terminals are second pads.

16. The method as recited in claim 12, wherein the connection conductors are connected to the connection terminals through reflow, thermal compression, or ultrasonic welding.

17. The method as recited in claim 12, wherein the connection conductors are formed on the first pads through plating, sputtering, printing, or ball placement.

18. The method as recited in claim 12, further comprising:
    forming a second redistribution layer after removing the metal layer, wherein the second redistribution layer covers a portion of the encapsulant and is electrically connected to the first redistribution layer.

19. The method as recited in claim 18, wherein the step of forming the second redistribution layer comprises:
    forming a first protection layer, the first protection layer covering a portion of the encapsulant and exposing the connection terminals and a portion of the at least one wiring pattern;
    forming a patterned wiring layer on the first protection layer and the first redistribution layer, the patterned wiring layer covering a portion of the first protection layer and being connected to the connection terminals and the portion of the at least one wiring pattern exposed by the first protection layer;
    forming a second protection layer on the first protection layer and the patterned wiring layer, the second protection layer exposing a portion of the patterned wiring layer; and
    forming a plurality of solder pads on the patterned wiring layer, the solder pads being respectively connected to the portion of the patterned wiring layer exposed by the second protection layer.

20. The method as recited in claim 19, further comprising:
    forming a plurality of second solder balls on the solder pads.

* * * * *